(12) United States Patent
Lai et al.

(10) Patent No.: US 9,570,568 B2
(45) Date of Patent: Feb. 14, 2017

(54) SEMICONDUCTOR COMPONENT AND METHOD FOR FABRICATING THE SAME

(71) Applicant: TAIWAN SEMICONDUCTOR MANUFACTURING CO., LTD., Hsinchu (TW)

(72) Inventors: Cheng-Chieh Lai, New Taipei (TW); Kuang-Hsin Chen, Taoyuan (TW); Shih-Kai Fan, Hsinchu (TW); Yung-Hsien Wu, Hsinchu (TW); Yu-Hsun Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/724,538

(22) Filed: May 28, 2015

(65) Prior Publication Data

US 2016/0351673 A1 Dec. 1, 2016

(51) Int. Cl.
*H01L 27/088* (2006.01)
*H01L 29/423* (2006.01)
*H01L 29/78* (2006.01)
*H01L 29/66* (2006.01)
*H01L 29/417* (2006.01)
*H01L 21/28* (2006.01)

(52) U.S. Cl.
CPC ... *H01L 29/42364* (2013.01); *H01L 21/28026* (2013.01); *H01L 27/0886* (2013.01); *H01L 29/41791* (2013.01); *H01L 29/66795* (2013.01); *H01L 29/785* (2013.01)

(58) Field of Classification Search
CPC ............... H01L 29/42364; H01L 21/28026; H01L 29/66795; H01L 29/66545; H01L 29/4966; H01L 27/0886; H01L 29/785; H01L 29/41791
See application file for complete search history.

(56) References Cited

U.S. PATENT DOCUMENTS

| | | |
|---|---|---|
| 2011/0108928 A1 | 5/2011 | Tao et al. |
| 2012/0181630 A1 | 7/2012 | Ando et al. |
| 2012/0326238 A1* | 12/2012 | Chien ............. H01L 21/823842 257/369 |
| 2013/0240979 A1 | 9/2013 | Lim et al. |
| 2014/0027859 A1* | 1/2014 | Gerhardt .......... H01L 21/28202 257/392 |
| 2015/0243564 A1* | 8/2015 | Zhao ................. H01L 29/66545 438/591 |

FOREIGN PATENT DOCUMENTS

KR 20120039136 A 4/2012

* cited by examiner

*Primary Examiner* — Yosef Gebreyesus
(74) *Attorney, Agent, or Firm* — Maschoff Brennan

(57) ABSTRACT

A semiconductor component, which includes a substrate, an interfacial layer disposed on the substrate, a first metal gate structure and a second metal gate structure disposed on the substrate. The first metal gate structure includes a first high-k dielectric layer disposed on the interfacial layer, and a first metal gate layer disposed on the first high-k dielectric layer. The second metal gate structure includes a second high-k dielectric layer disposed on the interfacial layer, a third high-k dielectric layer disposed on the second high-k dielectric layer, and a second metal gate layer disposed on the third high-k dielectric layer.

20 Claims, 9 Drawing Sheets

SEMICONDUCTOR COMPONENT AND METHOD FOR FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

The smaller feature size is the use of multigate devices such as fin field effect transistor (FinFET) devices. FinFETs are so called because a gate is formed on and around a "fin" that extends from the substrate. As the term is implemented in the present disclosure, a FinFET device is any fin-based, multigate transistor. FinFET devices may allow for shrinking the gate width of device while providing a gate on the sides and/or top of the fin including the channel region. Another advancement implemented as technology nodes shrink, in some IC designs, has been the replacement of the typically polysilicon gate electrode with a metal gate electrode to improve device performance with the decreased feature sizes. One method of forming the metal gate electrode is a "gate last" or "replacement gate" methodology where a dummy gate, typically polysilicon is replaced by a metal gate. Providing the metal gate later in the process can avoid problems of the stability of the work function metal during processing.

However, challenges in providing an appropriate stress and/or gate resistance in devices such as metal gate FinFETs. For example, low stress on the gate and/or high gate resistance can cause a degradation of performance of device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
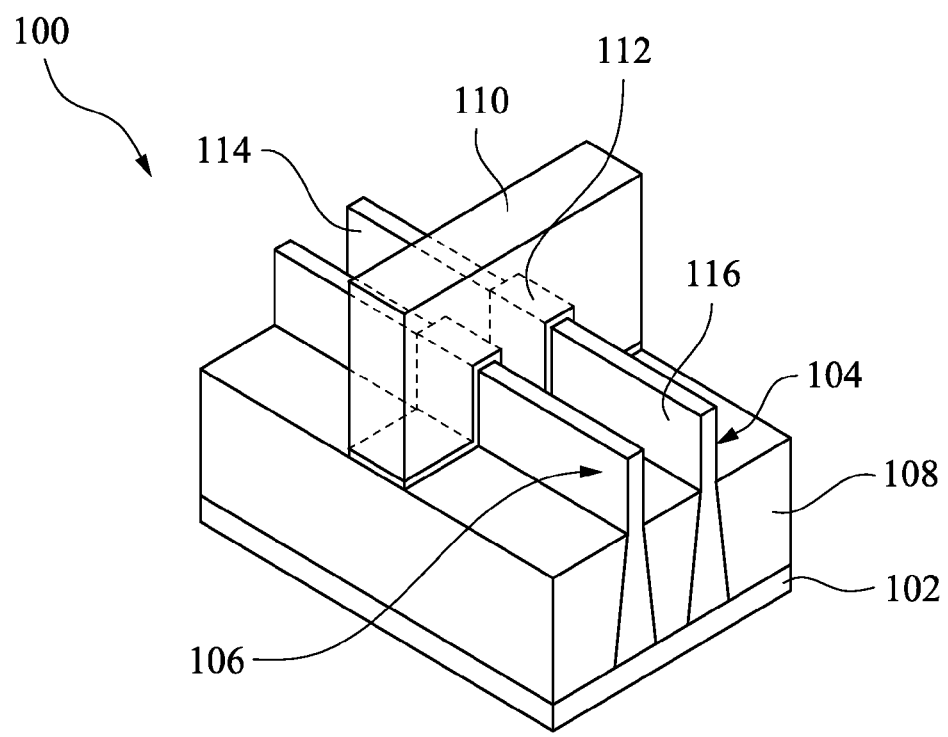
FIG. 1 is a perspective view of an embodiment of a FinFET device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates generally to semiconductor components, such as a FinFET device and method of fabricating a FinFET device or portion of a device. There has been a desire to replace the gate oxide and polysilicon gate electrode with a high-k gate dielectric and metal gate electrode to improve device performance as feature sizes continue to decrease. A gate last (or gate replacement) approach has been implemented to address concerns of high temperature processing on metal materials. However, challenges are raised in providing an appropriate stress and/or gate resistance in devices such as metal gate FinFETs. For example, low stress on the gate and/or high gate resistance can cause a degradation of performance of device. Therefore, there is a need to balance the stress and/or gate resistance in devices such as metal gate FinFETs, such that the gate leakage and/or work function can be improved.

FIG. 1 is a perspective view of an embodiment of a FinFET device according to some embodiments of the disclosure. The FinFET device 100 includes a substrate 102. In some embodiments, the substrate 102 includes a bulk silicon substrate. The substrate 102 may be silicon in a crystalline structure. In other embodiments, the substrate 102 may include other elementary semiconductors such as germanium, or include a compound semiconductor such as, silicon carbide, gallium arsenide, indium arsenide, and indium phosphide. In some other embodiments, the substrate 102 includes a silicon-on-insulator (SOI) substrate. The SOI substrate may be fabricated using separation by implantation of oxygen, wafer bonding, and/or other suitable methods.

The FinFET device 100 further includes fin structures 104, 106 (e.g., Si fins) that extend from the substrate 102. In some embodiments, the fin structures 104, 106 may optionally include germanium. The fin structures 104, 106 may be fabricated by using suitable processes such as photolithography and etch. In some embodiments, the fin structures 104, 106 are etched from the substrate 102 using dry etch or plasma processes. Shallow trench isolation (STI) structures 108 surround the fins 104, 106. The STI structures 108 may include any suitable insulating material. It is understood that although two fin structures are illustrated, additional parallel fins may be formed in a similar manner.

The FinFET device 100 further includes a gate structure 110. The gate structure 110 is formed on a central portion of the fin structures 104, 106. In some embodiments, multiple gate structures are formed over the fin structures. The gate structure 110 includes a gate dielectric layer and a gate electrode. It is understood that numerous other layers may also be present, for example, capping layers, interface layers, spacer elements, and/or other suitable features. In some embodiments, the gate dielectric layer may include an interfacial layer such as silicon oxide. The gate dielectric layer may further include other dielectric materials such as, silicon nitride, silicon oxinitride, dielectric with a high dielectric constant (high-k), and/or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide and/or combinations thereof. The gate electrode may include polysilicon and/or a metal including metal compounds such as, TiN, TaN, NiSi, CoSi, Mo, Cu, W, Al, Co, and/or other suitable conductive materials. The gate electrode may be formed in a gate last process (or gate replacement process) as will be explained below.

The fin structures 104, 106 include a channel region 112 surrounded by the gate structure 110. The fin structures 104, 106 may be doped to provide a suitable channel for an N-type FinFET (NMOS device) or P-type FinFET (PMOS device). The fin structures 104, 106 may be doped using processes such as, ion implantation, diffusion, annealing, and/or other suitable processes. The fin structures 104, 106 include a source region 114 and drain region 116 associated with the FinFET device 100. The source region 114 and drain region 116 may include an epitaxial (epi) silicon (Si) or epi silicon carbide (SiC) for an NMOS device, and epi silicon germanium (SiGe) or epi germanium (Ge) for a PMOS device. The FinFET device 100 may be a device included in a microprocessor, memory cell (e.g., SRAM), and/or other integrated circuits.

Figure 2A:
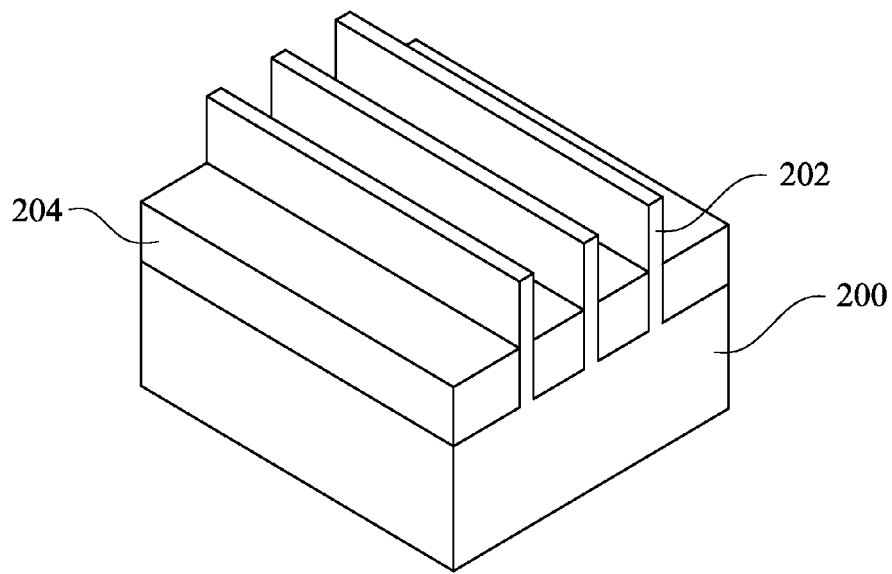
FIG. 2A to FIG. 2G are perspective views illustrating a method of forming a FinFET device according to some embodiments of the disclosure.

FIG. 2A to FIG. 2F are perspective views illustrating a method of forming a FinFET device according to some embodiments of the disclosure. In FIG. 2A, a semiconductor substrate is provided. The semiconductor substrate can be a silicon-containing substrate 200 with multiple fin structures 202 extending in a first direction. Thereafter, an insulating layer 204 is formed to fill the lower portions of gaps between the fin structures 202 as STI. The material of the insulating layer 204 can be, but is not limited to, silicon oxide. The method of forming the insulating layer 204 includes depositing an insulating material layer on the substrate 200 covering the fin structures 202, optionally performing a planarization process to make insulating layer 204 flat, and then performing an etching back process until the upper portions of the fin structures 202 are exposed. The fin structures 202 may includes source regions, drain regions, and channel regions connecting the source regions and the drain regions.

Figure 2B:
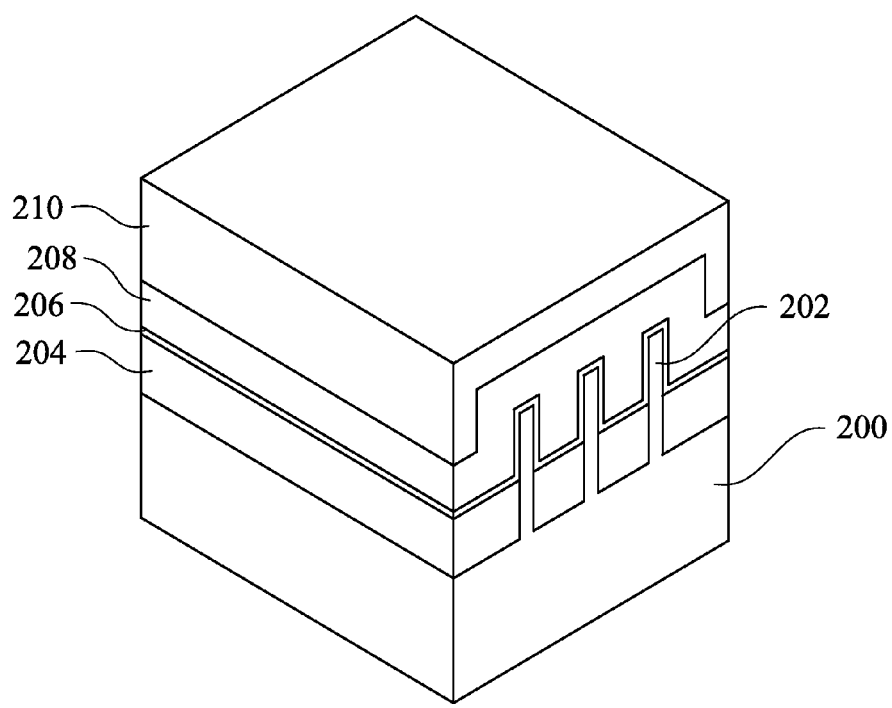

Referring to FIG. 2B, an interfacial layer 206 is conformally formed on the substrate 200 covering the fin structures 202. The interfacial layer 206 includes silicon oxide, silicon nitride or silicon oxynitride. The interfacial layer 206 is formed by a deposition process, such as an atomic layer deposition (ALD) process, a chemical vapor deposition (CVD) process, a physical vapor deposition (PVD) process or a sputter deposition process. It is noted that the interfacial layer 206 is formed by a deposition process rather than a thermal oxidation treatment. Silicon consumption due to the thermal oxidation treatment does not occur, so that the shape of the fins 102 is not deformed during the step of forming the interfacial layer 206. As shown in FIG. 2B, the interfacial layer 206 is conformally formed along the surface of each fin 202. In the present embodiment, since the interfacial layer 206 is formed by a deposition process without consuming any silicon, the shape of the fin structures 202 keeps well-defined after the formation of the interfacial layer 206.

Thereafter, a dummy gate material layer 208 and a mask layer 210 are sequentially formed on the interfacial layer 206. The dummy gate material layer 208 includes polysilicon. The mask layer 210 includes silicon oxide, silicon nitride, silicon oxynitride or a combination thereof. Each of the dummy gate material layer 208 and the mask layer 210 can be formed by a deposition process, such as an ALD process, a CVD process, a PVD process or a sputter deposition process. In FIG. 2B, a single mask layer 210 is provided for illustration purposes, but the present disclosure is not limited thereto. In another embodiment, the mask layer 210 can be a multi-layer structure including, for example, a lower silicon nitride layer and an upper silicon oxide layer.

Figure 2C:
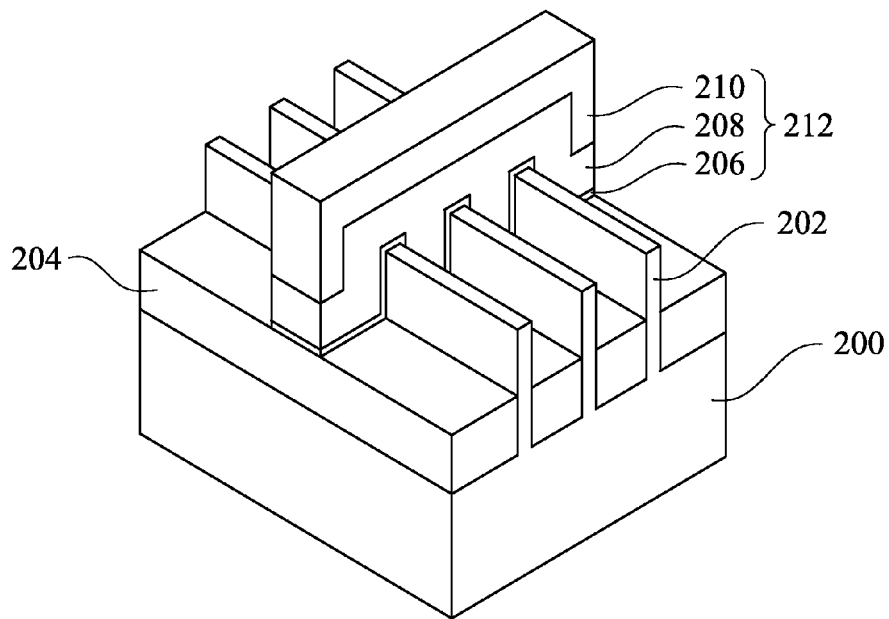

Referring to FIG. 2C, the mask layer 210, the dummy gate material layer 208 and the interfacial layer 206 are patterned to form a stacked structure 212 including the interfacial layer 206, the dummy gate material layer 208 and the mask layer 210 sequentially formed on the substrate 200. The stacked structure 212 crosses the fin structures 202 and extends in a second direction different from the first direction. In some embodiments, the second direction is perpendicular to the first direction. The patterning step includes performing photolithography and etching processes.

Figure 2D:
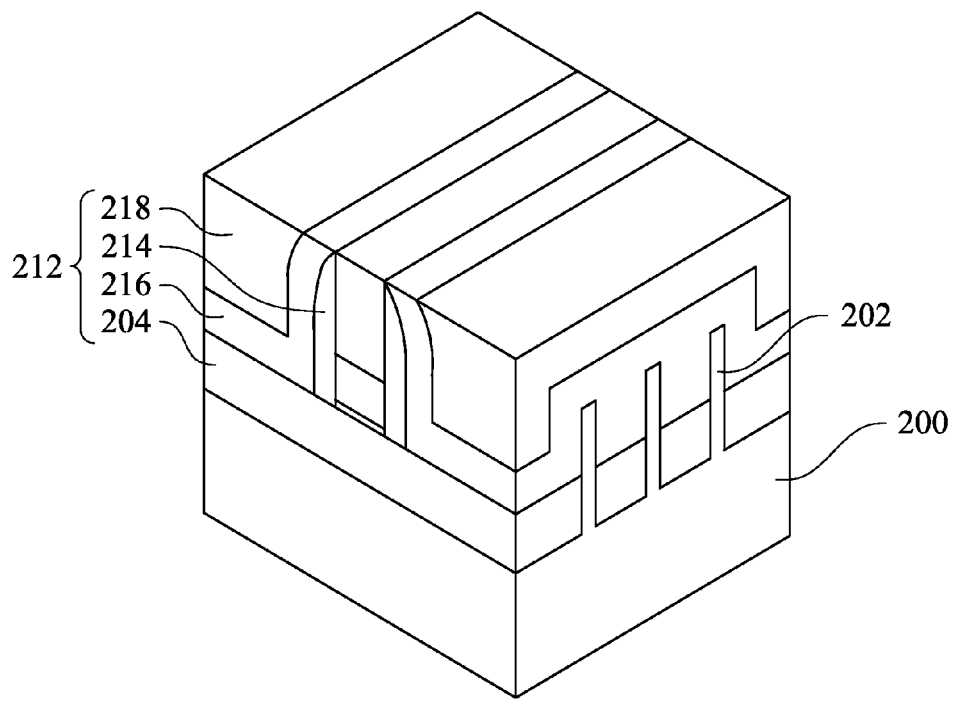

Referring to FIG. 2D, a spacer 214 is formed beside the stacked structure 212. The method of forming the spacer 214 includes forming a silicon oxide layer on the substrate 200 and then performing an anisotropic etching process to remove a portion of the silicon oxide layer. Source and drain regions (see FIG. 1) are then formed in the substrate 200 beside the spacer 214. Thereafter, a contact etch stop layer (CESL) 216 and an interlayer dielectric (ILD) layer 218 are sequentially formed on the substrate 200 to cover the stacked structure 212. The CESL 216 includes silicon nitride. The ILD layer 218 includes silicon oxide, silicon nitride, silicon oxynitride, silicon carbide, low-dielectric constant dielectric material or a combination thereof. Each of the CESL 216 and the ILD layer 218 can be formed by a deposition process, such as an ALD process, a CVD process, a PVD process or a sputter deposition process. Afterwards, a portion of the ILD layer 218 and a portion of the CESL 216 are removed to expose the top of the stacked structure 212.

Figure 2E:
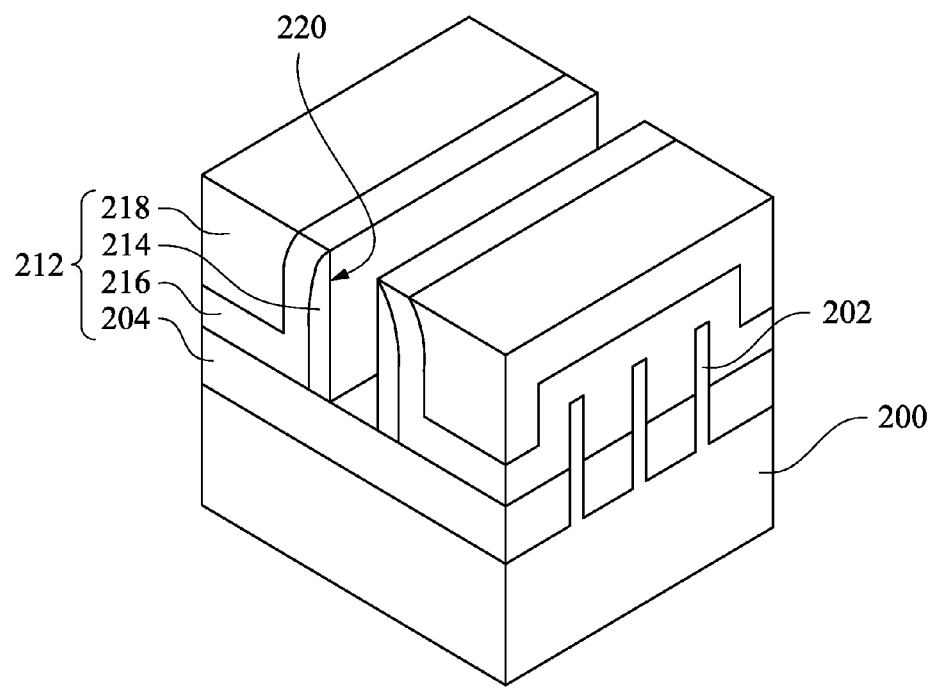

Referring to FIG. 2E, the stacked structure 212 is removed to form a trench 220 in the ILD layer 218. The removing step includes performing an etching back process. Note that the interfacial layer 206 can be regarded as a sacrificial layer since it is removed during the step of removing the stacked structure 212.

Figure 2F:
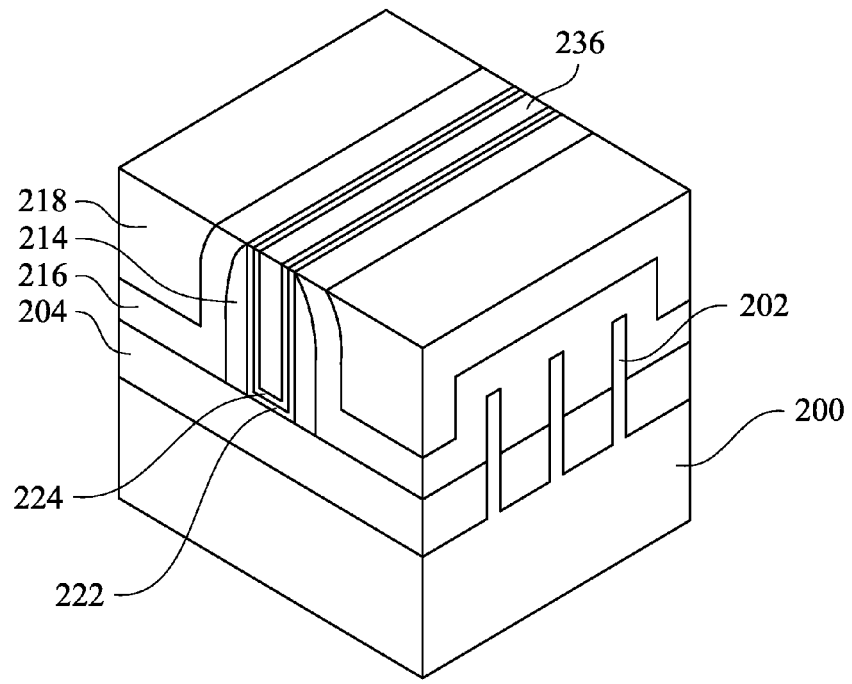

Referring to FIG. 2F, another interfacial layer 222 and a first high-k dielectric layer 224, are sequentially formed at least on the surface of the trench 220. The interfacial layer 222 includes silicon oxide, silicon nitride or silicon oxynitride. The interfacial layer 222 is formed by a deposition process, such as an ALD process, a CVD process, a PVD process or a sputter deposition process. It is noted that the interfacial layer 222 is formed by a deposition process rather than a thermal oxidation treatment. Silicon consumption due to the thermal oxidation treatment does not occur, so that the shape of the fin structures 202 is not deformed during the step of forming the interfacial layer 222. The interfacial layer 222 is conformally formed along the surface of each fin 202. In the some embodiments, since the interfacial layer 222 is formed by a deposition process without consuming any silicon, the shape of the fin structures 202 keeps well-defined after the formation of the interfacial layer 222.

The first high-k dielectric layer 224 includes a high-k material with high dielectric constant. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The first high-k dielectric layer 224 is formed by a deposition process, such as an ALD process, a CVD process, a PVD process or a sputter deposition process.

Thereafter, a composite metal layer 236 is formed on the substrate 200 to at least fill up the trench 220 as a stacked metal gate. Details of the composite metal layer 236 are discussed in FIG. 4A to FIG. 4E. Each layer of the composite metal layer 236 can be formed by a deposition process, such as an ALD process, a CVD process, a PVD process, a sputter deposition process or the like.

Figure 2G:
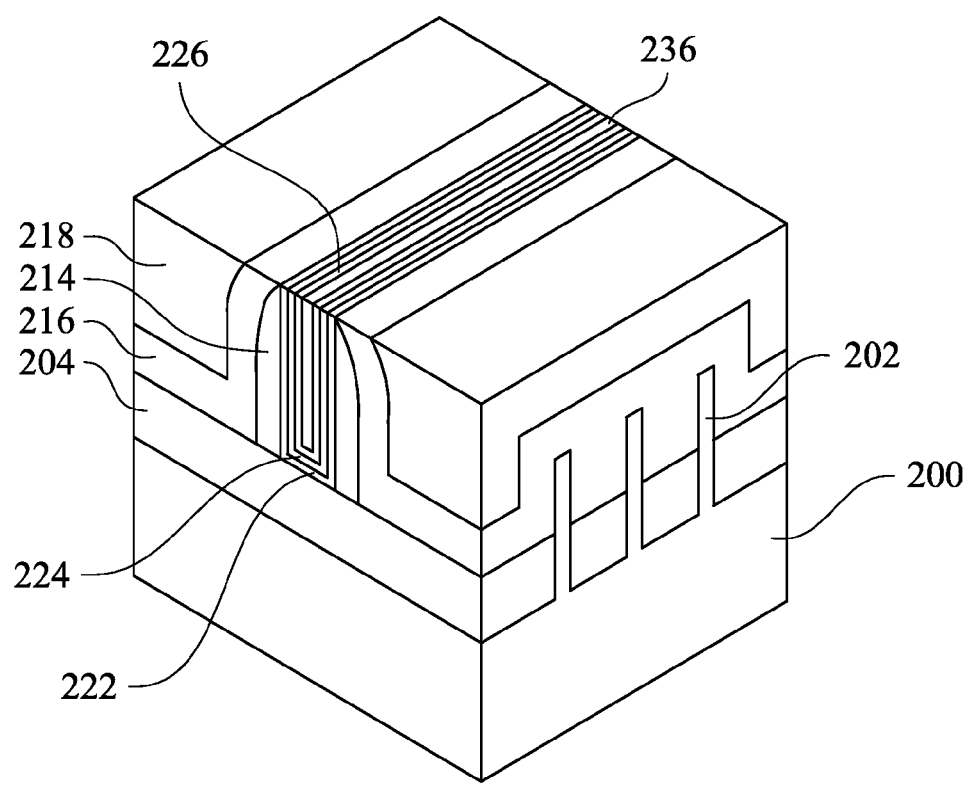

In some embodiments, the FinFET device may optionally includes a second high-k dielectric layer 226 on the first high-k dielectric layer 224, as shown in FIG. 2G, which follows after FIG. 2E. The first high-k dielectric layer 224 and the second high-k dielectric layer 226 are made of different high-k materials. The second high-k dielectric layer 226 can have a dielectric constant less than or greater than that of the first high-k dielectric layer 224. The high-k second high-k dielectric layer 226 can be made of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), or barium strontium titanate ($Ba_xSr_{1-x}TiO_3$, BST), wherein x is between 0 and 1. The second high-k dielectric layer 226 is formed by a deposition process, such as an ALD process, a CVD process, a PVD process or a sputter deposition process.

Afterwards, the interfacial layer 222, the first high-k dielectric layer 224, the second high-k dielectric layer 226 (optionally), and the composite metal layer 236 outside the trench 220 are removed. The FinFET device is thus obtained, wherein the first high-k dielectric layer 224, and the second high-k dielectric layer 226 (optionally) serve as a gate dielectric layer, and the composite layer 236 serves as a metal gate electrode. The contact etch stop layer (CESL) 216 and the interlayer dielectric (ILD) layer 218 are revealed in FIG. 1.

Figure 3:
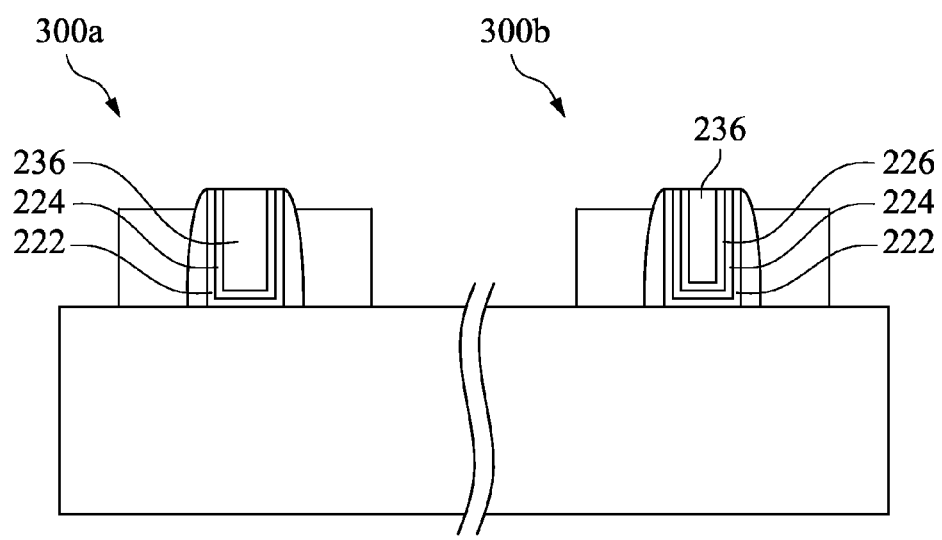
FIG. 3 is a cross-sectional view of a semiconductor component according to some embodiments of the disclosure.

Referring to FIG. 3, which is a cross-sectional view of a semiconductor component according to some embodiments of the disclosure. In some embodiments, the semiconductor component includes both of the FinFET devices 300a with the first high-k dielectric layer 224, and the FinFET devices 300b with both the first high-k dielectric layer 224 and the second high-k dielectric layer 226. The ratio of the amount of the FinFET devices 300a, which has monolayer high-k dielectric, to that of the FinFET devices 300b, which has bilayer high-k dielectric, can be designed according to different desires. For example, in some embodiments, the amount of the FinFET devices 300a is more than the amount of the FinFET devices 300b. However, the amount of the FinFET devices 300a can be less than or equal to the amount of the FinFET devices 300b. Also, the position and the arrangement of the FinFET devices 300a and FinFET devices 300b can be varied according to different requirements.

The ratio of the FinFET devices 300a to the FinFET devices 300b can be utilized to tune the threshold voltage ($V_T$). For example, the threshold voltage of the FinFET devices 300b is shifted toward negative direction, compared with the threshold voltage of the FinFET devices 300a. Thus the saturation current (Isat) and the leakage of the semiconductor component can be improved by properly designing the ratio of the FinFET device 300a to the FinFET devices 300b and the arrangement thereof.

Furthermore, since the threshold voltage can be adjusted by incorporating the FinFET devices 300b with bilayer high-k dielectric, the stack layers of composite metal layer 236 of forming the metal gate can be reduced. The reduction of loops of forming the layers of the metal gate may save the cost and fabricating time of forming the semiconductor components.

Figure 4A:
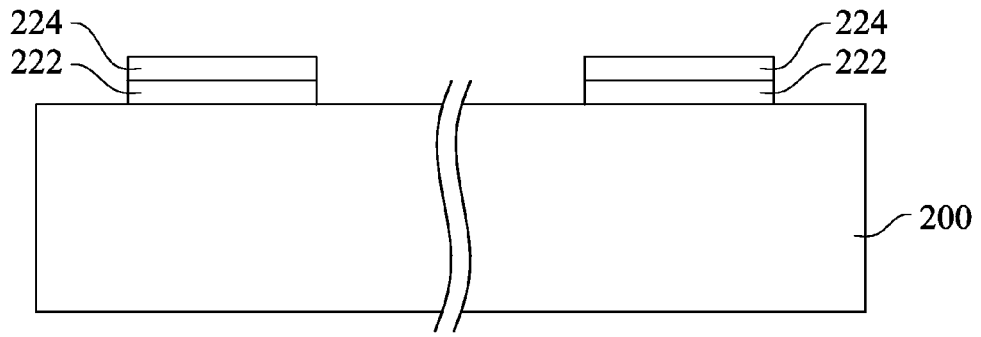
FIG. 4A to FIG. 4E are schematic views of different states of fabricating the FinFET devices, in accordance of some embodiments of the disclosure.

FIG. 4A to FIG. 4E are schematic views of different states of fabricating the FinFET devices 300a and FinFET devices 300b, in accordance of some embodiments of the disclosure. More particularly, FIG. 4A to FIG. 4E are related to the fabrication of the composite metal layer 236 of the FinFET device 300a and FinFET devices 300b, in which the composite metal layer 236 is formed filling the trench 220 (see FIG. 2E). In FIG. 4A, an interfacial layer 222 is formed on the substrate 200, and a first high-k dielectric layer 224 is formed on the interfacial layer 222. The interfacial layer 222 includes silicon oxide, silicon nitride or silicon oxynitride. The interfacial layer 222 is formed by a deposition process, such as an ALD process, a CVD process, a PVD process or a sputter deposition process. The first high-k dielectric layer 224 includes a high-k material with high dielectric constant. The high-k material can be metal oxide, such as rare earth metal oxide. The first high-k dielectric layer 224 is formed by a deposition process, such as an ALD process, a CVD process, a PVD process or a sputter deposition process.

Figure 4B:
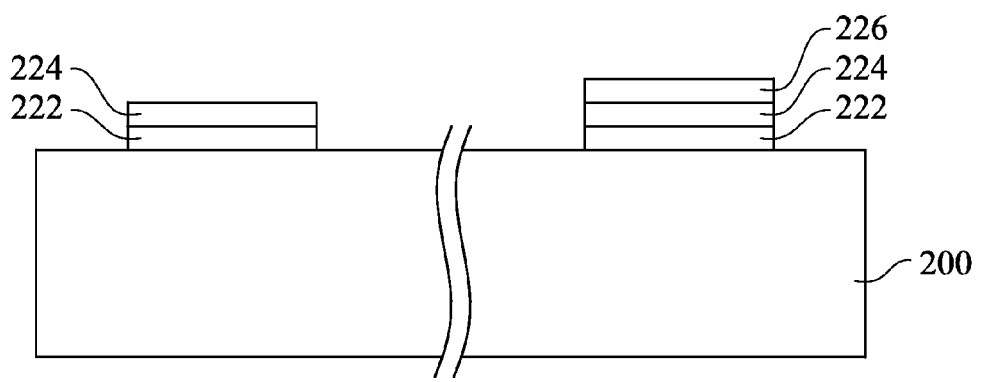

Referring to FIG. 4B, a second high-k dielectric layer 226 is formed on a part of the first high-k dielectric layer 224. The second high-k dielectric layer 226 includes a high-k material with high dielectric constant. The high-k material can be metal oxide, such as rare earth metal oxide. The dielectric constant of the first high-k dielectric layer 224 can be greater or less than that of the second high-k dielectric layer 224. The thickness of the first high-k dielectric layer 224 can be greater than, equal to, or less than that of the second high-k dielectric layer 226. The second high-k dielectric layer 226 is formed by a deposition process, such as an ALD process, a CVD process, a PVD process or a sputter deposition process.

Figure 4C:
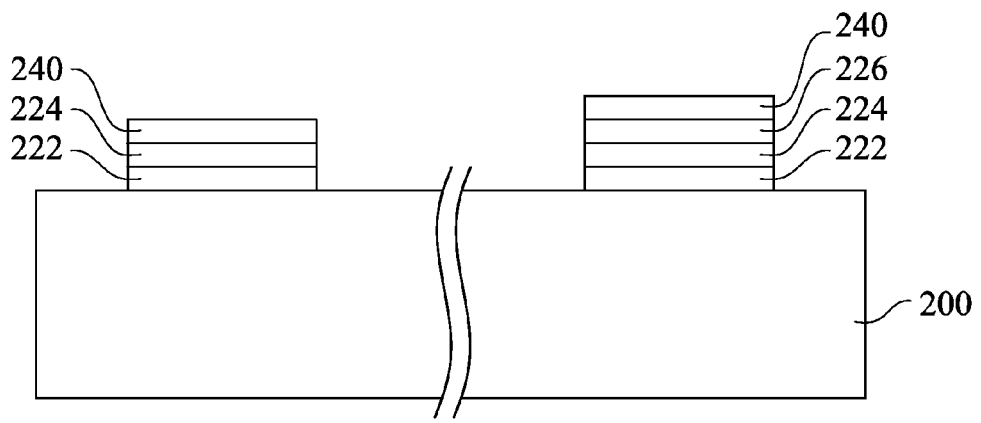

Referring to FIG. 4C, a barrier layer 240 is formed on and capping the second high-k dielectric layer 226 and the exposed part of the first high-k dielectric layer 224. The barrier layer 240 can be a metal layer, such as a titanium nitride (TiN) layer. The barrier layer 240 can be formed by a deposition process, such as an ALD process, a CVD process, a PVD process or a sputter deposition process.

The barrier layer 240 can also be formed by a nitridation process, such as using a thermal chemical vapor deposition reaction between ammonia ($NH_3$) and titanium tetrachloride ($TiCl_4$). In some embodiments, the surface of the barrier layer 240 can be further treated by a nitridation process, such as using ammonia gas. Alternatively, in some embodiments, a post metal anneal (PMA) process can be utilized to improve the density and the quality of the first high-k dielectric layer 224, the second high-k dielectric layer 226, and the barrier layer 240.

Figure 4D:
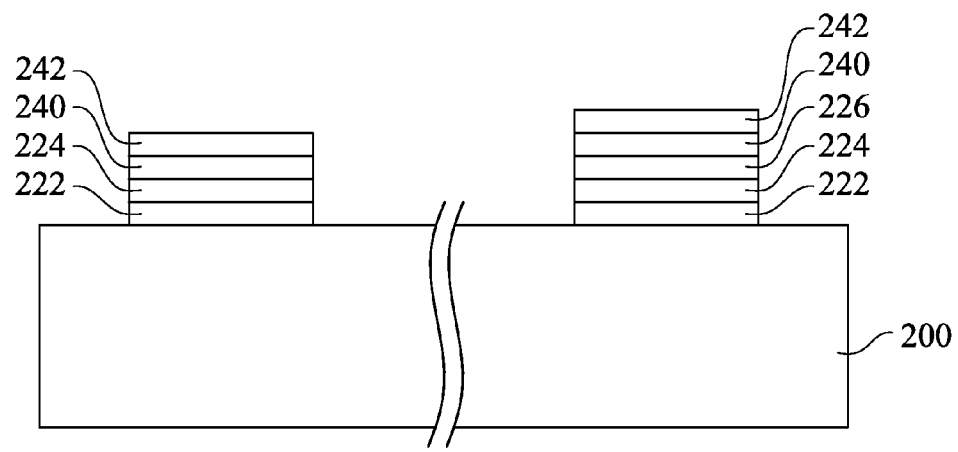

In FIG. 4D, a work function metal layer 242 is formed on the barrier layer 240. In some embodiments, the FinFET device can be a NMOS device, and the work function metal layer 242 can be made of, for example, Ti, Ag, Al, TiAlMo, Ta, TaN, TiAlC, TiAlN, TaC, TaCN, TaSiN, Mn, Zr, or combinations thereof. Alternatively, the FinFET device can be a PMOS device, and the work function metal layer 242 can be made of, for example, TiN, W, Ta, Ni, Pt, Ru, Mo, Al, WN, or combinations thereof. The work function metal layer 242 can be formed by a deposition process, such as an ALD process, a CVD process, a PVD process or a sputter deposition process.

Figure 4E:
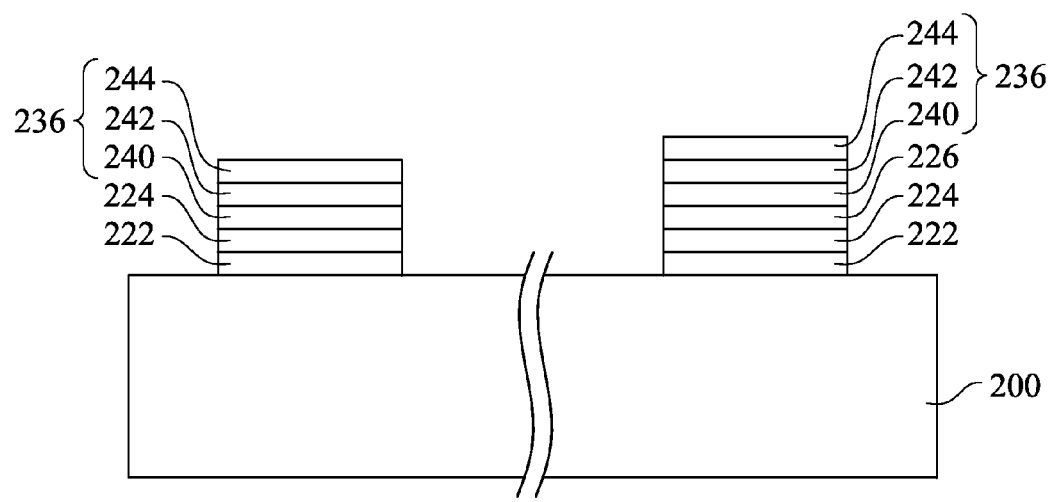

In FIG. 4E, the metal gate layer 244 is formed on the work function metal layer 242. The metal gate layer 244 is deposited on the work function metal layer 242 by ALD, PVD, CVD, or other processes. The metal gate layer 244 is made of, for example, Al, W, Co, Cu.

The first high-k dielectric layer 224 or the first high-k dielectric layer 224 and the second high-k dielectric layer 226 are utilized as a gate dielectric in the FinFET device 300a and FinFET device 300b (see FIG. 3). The composite metal layer 236 including, from bottom to top, the barrier layer 240, the work function metal layer 242, and the metal gate layer 244 is formed and is utilized as a metal gate structure in the FinFET device 300a and the FinFET device 300b.

The semiconductor component may utilize both the FinFET devices 300a device with the first high-k dielectric layer 224, and the FinFET devices 300b with both the first high-k dielectric layer 224 and the second high-k dielectric layer 226, such that the performance of the semiconductor component can be tuned by arranging the FinFET devices 300a and the FinFET devices 300b. Therefore, the thickness and the layers of the metal gate layer 244 can be reduced.

However, the concept can also be utilized in other active devices, for example, a P-channel field effect transistor (PFET), N-channel field effect transistor (NFET), metal oxide semiconductor field effect transistor (MOSFET), complementary metal oxide semiconductor (CMOS) transistor, bipolar transistor, high voltage transistor, and high frequency transistor, and other memory units, any combination thereof and/or other semiconductor components.

Figure 5:
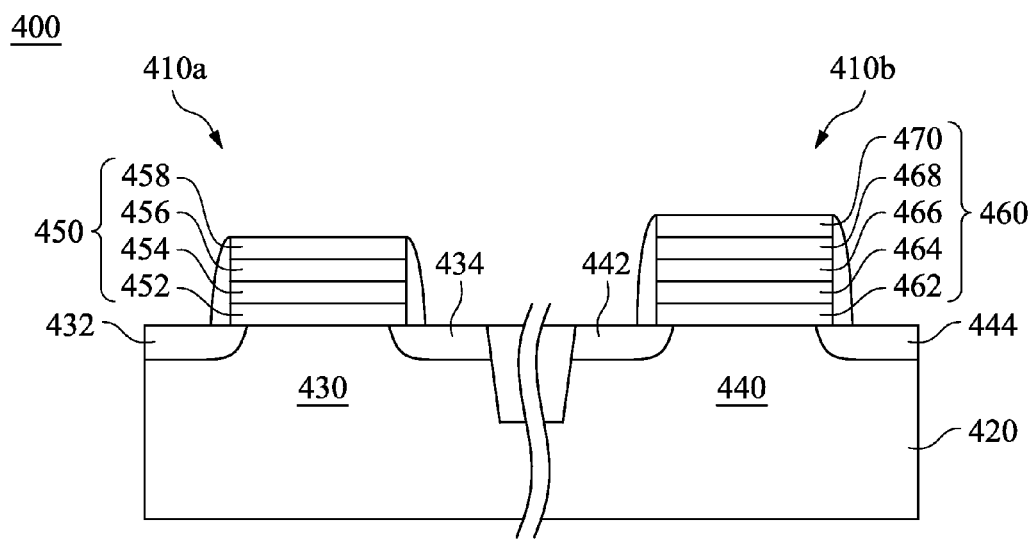
FIG. 5 is a cross-sectional view of a semiconductor component, in accordance with some embodiments of the disclosure.

FIG. 5 is a cross-sectional view of a semiconductor component, in accordance with some embodiments of the disclosure. The semiconductor component 400 includes a device 410a and a device 410b, in which the device 410a is formed on the first region 430 of the substrate 420, and the device 410b is formed on the second region 440 of the substrate 420. The device 410a has a source 432 and a drain 434 in the substrate 420, and a metal gate structure 450 on the substrate 420. The metal gate structure 450 includes, from bottom to top, an interfacial layer 452, a first high-k dielectric layer 454, a work function metal layer 456, and a metal gate layer 458, in which the first high-k dielectric layer 454 serves as gate dielectric, and the work function metal layer 456 and the metal gate layer 458 serve as metal gate. The device 410b has a source 442 and a drain 444 in the substrate 420, and a metal gate structure 460 on the substrate 420. The metal gate structure 460 includes, from bottom to top, an interfacial layer 462, a first high-k dielectric layer 464, a second high-k dielectric layer 466, a work function metal layer 468, and a metal gate layer 470, in which the first high-k dielectric layer 464, the second high-k dielectric layer 466 serve as gate dielectric, and the work function metal layer 468 and the metal gate layer 470 serve as metal gate. The interfacial layers 452 and 462 can be formed by the same process. In some embodiments, the first high-k dielectric layer 454 and 464 are made of same material and formed by the same process. In some embodiments, the first high-k dielectric layer 454 and the second high-k dielectric layer 466 are made of same material and formed by the same process.

As discussed above, the performance of the semiconductor component can be tuned by the using both devices 410a and 410b. Therefore, the thickness and layers of the metal gate layers 458 and 470 can be reduced. The cost and fabricating time can also be reduced since the fabricating loops of the metal gates 450 and 460 are reduced.

According to above embodiments, the semiconductor component utilizes devices with monolayer high-k dielectric layer, and the devices with bilayer high-k dielectric layer, thus the performance, such as threshold voltage, saturation current, and the leakage can be improved by the arrangement and the ratio of the devices. Therefore, the layers and the thickness of the metal gate layer can be reduced, and the fabricating loops of the metal gate can be simplified.

An aspect of the disclosure provides a semiconductor component, which includes a substrate, an interfacial layer disposed on the substrate, a first metal gate structure and a second metal gate structure disposed on the substrate. The first metal gate structure includes a first high-k dielectric layer disposed on the interfacial layer, and a first metal gate layer disposed on the first high-k dielectric layer. The second metal gate structure includes a second high-k dielectric layer disposed on the interfacial layer, a third high-k dielectric layer disposed on the second high-k dielectric layer, and a second metal gate layer disposed on the third high-k dielectric layer.

Another aspect of the disclosure provides a semiconductor component including a first device and a second device. The first device includes a first source, a first drain, and a first metal gate structure disposed between the first source and the first drain. The first metal gate structure includes a first high-k dielectric layer, and a first metal gate layer disposed on the first high-k dielectric layer. The second device includes a second source, a second drain, and a second metal gate structure disposed between the second source and the second drain. The second metal gate structure includes a second high-k dielectric layer, a third high-k dielectric layer disposed on the second high-k dielectric layer, and a second metal gate layer disposed on the third high-k dielectric layer.

Another aspect of the disclosure provides a method for fabricating a semiconductor component. The method includes forming an interfacial layer on a substrate, forming a first high-k dielectric layer on the interfacial layer, forming a second high-k dielectric layer on a part of the first high-k dielectric layer, forming a barrier layer on the second high-k dielectric layer and the exposed part of the first high-k dielectric layer, and forming a metal gate layer on the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor component, comprising:
    a substrate;
    an interfacial layer disposed on the substrate;
    a first metal gate structure disposed on the substrate, comprising:
        a first high-k dielectric layer disposed on the interfacial layer;
        a first barrier layer in contact with the first high-k dielectric layer; and
        a first metal gate layer disposed on the first barrier layer; and
    a second metal gate structure disposed on the substrate, comprising:
        a second high-k dielectric layer disposed on the interfacial layer;
        a third high-k dielectric layer disposed on the second high-k dielectric layer, wherein the second high-k dielectric layer is between the third high-k dielectric layer and the interfacial layer, and the first high-k dielectric layer and the third high-k dielectric layer are made of different materials; and
        a second metal gate layer disposed on the third high-k dielectric layer.

2. The semiconductor component of claim 1, wherein a dielectric constant of the second high-k dielectric layer is greater than a dielectric constant of the third high-k dielectric layer.

3. The semiconductor component of claim 1, wherein the first high-k dielectric layer and the second high-k dielectric layer are made of the same material.

4. The semiconductor component of claim 1, further comprising a first work function metal layer disposed on the first barrier layer.

5. The semiconductor component of claim 1, further comprising a second work function metal layer disposed on the third high-k dielectric layer.

6. The semiconductor component of claim 5, further comprising a second barrier layer disposed between the third high-k dielectric layer and the second work function metal layer.

7. The semiconductor component of claim 1, wherein the second metal gate structure comprises a second barrier layer in contact with the third high-k dielectric layer.

8. The semiconductor component of claim 7, wherein the first barrier layer and the second barrier layer are made of the same material.

9. A semiconductor component, comprising:
    a plurality of first devices, each of the plurality of the first devices comprising:
        a first source;
        a first drain; and
        a first metal gate structure disposed between the first source and the first drain, the first metal gate structure comprising:
            a first high-k dielectric layer; and
            a first metal gate layer disposed on the first high-k dielectric layer; and
    a plurality of second devices, each of the plurality of the second devices comprising:
        a second source;
        a second drain; and
        a second metal gate structure disposed between the second source and the second drain, the second metal gate structure comprising:
            a second high-k dielectric layer;
            a third high-k dielectric layer disposed on the second high-k dielectric layer; and
            a second metal gate layer disposed on the third high-k dielectric layer, wherein a number of the plurality of the first devices is greater or less than a number of the plurality of the second devices.

10. The semiconductor component of claim 9, wherein a threshold voltage of at least one of the plurality of the first devices is different from a threshold voltage of at least one of the plurality of the second devices.

11. The semiconductor component of claim 9, wherein the plurality of the first devices and the plurality of the second devices are FinFET devices.

12. The semiconductor component of claim 9, wherein each of the plurality of the first devices further comprises a first work function metal layer disposed between the first high-k dielectric layer and the first metal gate layer.

13. The semiconductor component of claim 9, wherein each of the plurality of the second devices further comprises a second work function metal layer disposed between the third high-k dielectric layer and the second metal gate layer.

14. The semiconductor component of claim 9, wherein a material of the first high-k dielectric layer is the same as a material of the second high-k dielectric layer.

15. The semiconductor component of claim 9, wherein a material of the first high-k dielectric layer is the same as a material of the third high-k dielectric layer.

16. A method for fabricating a semiconductor component, comprising:
    forming an interfacial layer on a substrate;
    forming a first high-k dielectric layer on the interfacial layer;
    forming a second high-k dielectric layer on a first part of the first high-k dielectric layer, wherein the first part of the first high-k dielectric layer is between the second high-k dielectric layer and the interfacial layer;
    forming a barrier layer on the second high-k dielectric layer and directly on a second part of the first high-k dielectric layer; and
    forming a metal gate layer on the barrier layer.

17. The method of claim 16, wherein a dielectric constant of the first high-k dielectric layer is greater than a dielectric constant of the second high-k dielectric layer.

18. The method of claim 16, wherein a dielectric constant of the first high-k dielectric layer is less than a dielectric constant of the second high-k dielectric layer.

19. The method of claim 16, further comprising forming a work function metal layer between the barrier layer and the metal gate layer.

20. The method of claim 19, wherein the barrier layer, the work function metal layer, and the metal gate layer form a metal gate structure of a FinFET device.

* * * * *